United States Patent [19]
Gemra et al.

[11] Patent Number: 5,979,672
[45] Date of Patent: Nov. 9, 1999

[54] EARTHQUAKE RESISTANT ENCLOSURE FOR ELECTRONIC EQUIPMENT

[75] Inventors: Richard John Gemra, Basking Ridge; Richard Gerard Kluge, West Millford; John Arthur Murphy, Landing; Theodore Arthur Shankoff, Rahway; Barry Russell Vaning, Mountainside, all of N.J.

[73] Assignee: Telcordia Technologies, Inc., Morristown, N.J.

[21] Appl. No.: 08/630,304

[22] Filed: Apr. 10, 1996

[51] Int. Cl.⁶ ............................................. A47F 7/00
[52] U.S. Cl. ............................................. 211/26; 211/189
[58] Field of Search ................ 211/26, 175, 182, 211/189, 193; 361/688, 724, 829, 831; 108/104; 312/223.1, 223.6, 265.1, 265.2, 265.3, 265.4, 223.2

[56] References Cited

U.S. PATENT DOCUMENTS

| | | | |
|---|---|---|---|
| 4,715,502 | 12/1987 | Salmon | 211/26 |
| 4,754,369 | 6/1988 | Nilsson | 312/257.1 X |
| 5,165,770 | 11/1992 | Hahn | 211/26 X |
| 5,233,129 | 8/1993 | Hall | 361/724 X |
| 5,292,189 | 3/1994 | Lau et al. | 361/724 X |
| 5,323,916 | 6/1994 | Salmon | 211/26 |
| 5,328,260 | 7/1994 | Beirise | 312/223.6 |
| 5,372,262 | 12/1994 | Benson et al. | 211/26 |
| 5,435,641 | 7/1995 | Dumon Dupuis et al. | 312/223.1 |
| 5,443,312 | 8/1995 | Schluter | 312/223.6 X |
| 5,536,079 | 7/1996 | Kostic | 312/223.1 X |

*Primary Examiner*—Leslie A. Braun
*Assistant Examiner*—Gwendolyn Baxter
*Attorney, Agent, or Firm*—Joseph Giordano

[57] ABSTRACT

An unitized monocoque enclosure for housing electronic equipment, as in a communications system central office, has side, top and bottom panels of corrugated metal. The panels comprise a continuous envelope for the structure and themselves constitute the structural support for electronic equipment shelves and the electronic equipment mounted thereby, which shelves are supported by screw members directly into a corrugation of the side panels. No additional, uprights, frame supports or braces are utilized. The resultant structure is both simple to fabricate and achieves improved earthquake resistance.

17 Claims, 5 Drawing Sheets

EARTHQUAKE RESISTANT ENCLOSURE FOR ELECTRONIC EQUIPMENT

This invention relates to enclosures, such as frame and cabinets for supporting electronic equipment, as in a telephone central office, and more specifically to such enclosures that can be readily made to withstand earthquake loads without any added internal supports or braces.

BACKGROUND OF THE INVENTION

Electronic equipments are the heart of many modern systems and especially of today's communications systems. Traditionally such equipments were large and bulky, including using mechanical elements such as relays. Today the equipments tend to be smaller and compact, using semiconductors and optical elements. This has meant that central offices for telephone systems no longer use large and high equipment frames with spacing between equipments but now are being designed with smaller equipment frames or cabinets with the components more compactly mounted and with heat dissipation of more concern than in the past.

Further the concentration of electronic components has increased concerns over the reliability and survivability of the equipment when catastrophic conditions occur, such as earthquakes. It is axiomatic that if an earthquake occurs the need for effective and operational communications systems is the greatest.

Two basic structures are generally used to support electronics equipment in central offices; these are the frame and the cabinet, both of which may be generically referred to as equipment enclosures.

Equipment frames used to support electronics equipment typically utilize two uprights welded to a base having facilities for fastening to a concrete floor. A horizontal crossmember welded to the two uprights provides additional frame stiffness and a support for cable. The uprights are typically open-channel construction that may be used for routing signal cable. The base of the frame is enclosed for routing power cable.

Frame bases generally have narrow depths causing them to be unstable, especially when heavily loaded and/or subject to earthquake shocks. The overall strength of the frame is generally limited by the cross-section and dimensions of the uprights and the strength and positions of the concrete anchors. Their tall, open construction shape causes most frames to be flexible in the side-to-side direction. They therefore depend upon the stiffness and placement of the installed electronics or upon specially located stiffeners and bracing members for additional overall strength.

Typical equipment cabinets consist of four uprights that form a rectangular box-like frame for supporting the equipment. The uprights are connected to an outer sheet-metal face on each side. Provisions for the attachment of both front and rear doors are generally made. As with the frames, the strength of the typical cabinet is limited by the uprights. These uprights are often not directly connected at the top or the base, and in such instances the load of the equipment within the cabinet is not transferred to the structure of the cabinet. Additional loss of strength may be expected if the top or base is cut away to provide cable access.

Typical of the prior art approach to increasing the strength of the equipment cabinet or frame against major stresses, such as earthquake shocks, is the complicated use of special support members, as in Sevier et al patent 5,004,107, issued Apr. 2, 1991. Such apparatus involves complicated manufacturing steps and additional bracing elements. The manufacturing of such enclosures thus involves a large number of process steps in order to provide the required features, including cable routing, fastening equipment shelves, and the desired strength and earthquake resistance reliability. Further, these prior enclosures are generally designed for installation on either concrete floors or raised floors, but not both. Installations on raised floors require deep bases for stability and may require cables to enter the frame or cabinet from overhead. Prior enclosures do not generally provide for either overhead or underfloor cable routing in a single design.

SUMMARY OF THE INVENTION

Our invention provides an enclosure, that may be used as either a frame or a cabinet for electronic equipment, wherein the exterior panels themselves constitute the enclosure's structural members and no support uprights are utilized. Corrugated metal sheets are used for the side, top, and bottom panels in a unitized structure, the panels being welded together to form the structure and to eliminate the need for either uprights or additional structural or bracing members, as has been previously thought essential for earthquake resistance.

An enclosure in accordance with our invention may be fabricated in a number of different ways, each of which, however, offers significant manufacturing advantages and economics. In one exemplary way of fabricating an enclosure of our invention, a steel sheet is rolled or otherwise shaped to form the corrugated section. The corrugated sheet is then cut to lengths to form the top, bottom, and side sections of the enclosure. The needed cable holes for the top and bottom are punched in a press. The sections are then held in a fixture, their ends cut at 45°, and the ends then joined together with full fillet welded miter joints. We have found that such miter joints provide superior moment transfer from the side to the top and base of the enclosure as compared to butt welding the panels to intermediate members at these corner joints, and are less costly.

In accordance with our invention and this method of fabrication, only two different lengths of the corrugated metal sheet are required to fabricate an enclosure, and the height and width dimensions of the enclosure may be easily changed by adjusting the sheet lengths. In this way different lengths of corrugated sheets can form an entire modular family of enclosures.

In accordance with an alternative method of fabrication, the steel sheet is again rolled or otherwise shaped to form the corrugated section. However, instead of cutting the sheet into the individual lengths for the top, bottom, and side sections, the sheet is crimped at the lengths to define these individual sections and then bent to define right angles at these corners of the enclosure. Advantageously, the single corrugated sheet has its two ends welded or otherwise joined together at the center of the top section of the enclosure, where the earthquake stress on the enclosure is the least.

In accordance with our invention, the strength of the structure relies on the corrugated sheet sections to carry the weight and not any internal frame or uprights; this is known as a monocoque structure. Further, since door panels are not required for structural strength, the same enclosure can serve as a frame, without doors, or a cabinet by the addition of front and/or back doors and the mounting hardware.

Accordingly, our invention comprises an enclosure structure, either a frame or a cabinet, for housing electronic equipment and having a unitized monocoque structure constructed of a single corrugated sheet which may be cut to the appropriate lengths and incorporated as the side, top, and, bottom panels, then welded together, advantageously with 45° miter joints or may be a single sheet bent at the corners of the enclosure. Our unitized monocoque structure provides all attachments for shelves for the interior electronic equipment, access for exterior cabling, integral interior cables runs in the channels of the corrugated sections, and the capability for mounting doors if a cabinet and not a frame is desired. Further when two such enclosures are positioned adjacent each other, the mating channels provide cooling or air ducts for the electronic equipment.

In the prior art, inner legs, uprights, or other separate support members have been utilized in frames and cabinets to carry the load of the electronic or communications equipment, with the skin of the frame or cabinet just being there to cover or enclose the equipment. However, in enclosures in accordance with our invention no distinct supporting uprights, legs or other members are utilized and, in fact, it is the covering skin of the enclosure which both carries the equipment load and bears the earthquake stress. Even though in accordance with our invention, it is the skin that carriers the load, we have found that our unitized monocoque structure provides superior stiffness and strength, for improved earthquake resistance, in comparison to prior art electronics cabinets and frames. Specifically our computer modeling has indicated that our enclosure betters the side-to-side stiffness and earthquake resistance of the frame shown in the Sevier et al patent by a factor of about 5 and its front to back stiffness and earthquake resistance by a factor of about 3 to 4.

BRIEF DESCRIPTION OF THE DRAWING

These and other advantageous features of our invention can be understood from the following detailed description together with the accompanying drawing, in which.

Figure 1:
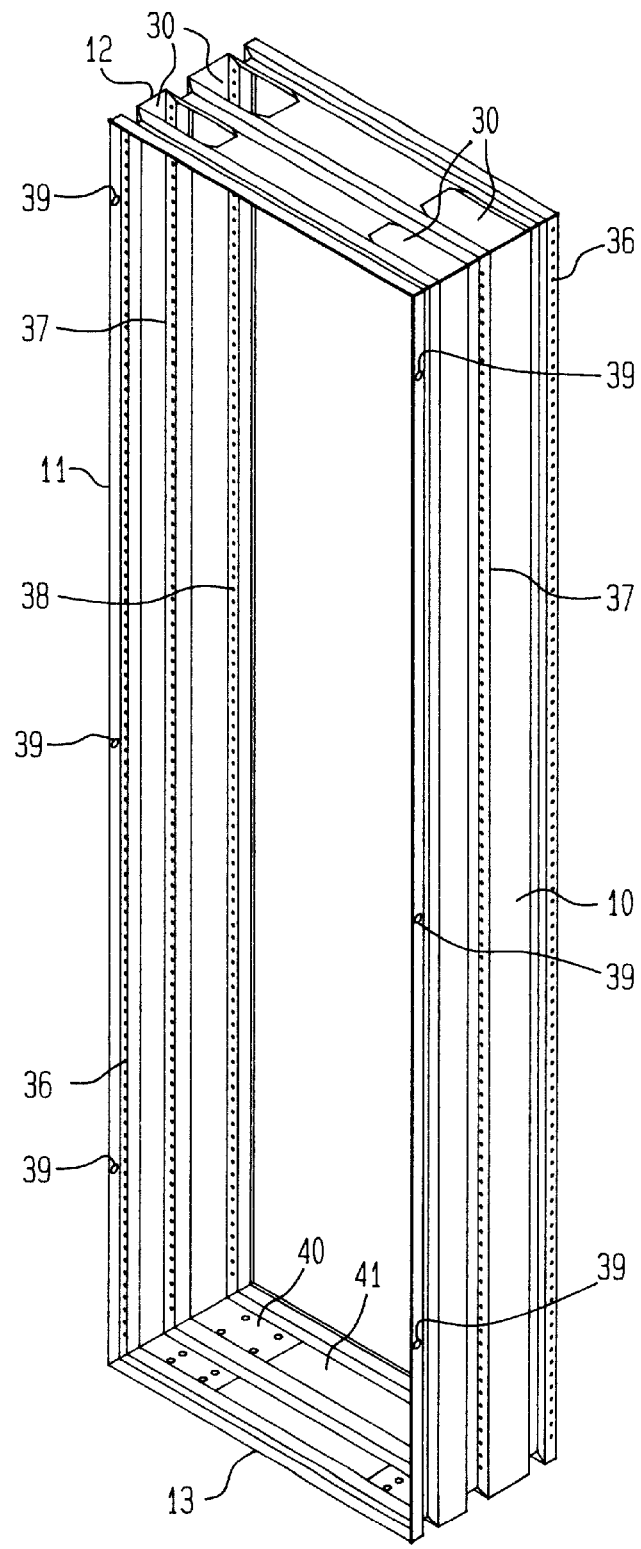
FIG. 1 is a perspective view of an illustrative embodiment of an enclosure in accordance with our invention, the enclosure being an equipment frame.

Turning now to the drawing, the enclosure in accordance with our invention has side panels 10 and 11, a top panel 12, and a base panel 13. Each of these panels is cut from the same rolled corrugated metal sheet. The sheet is advantageously of metal, such as thin steel (ASTM A569, 12 gauge or equivalent), as of the order of 0.104 inches or 2.6 mm thick, and formed to have a plurality of channels defining a corrugated sheet. The number of channels defining the corrugated sheet will depend on the depth of the enclosure desired. In the embodiment depicted in FIG. 1, as clearly seen in FIG. 2, three channels 15, 16 and 18 have been formed in the corrugated sheet, which i n this embodiment has an overall depth of 450 mm. Advantageously we have found it desirable that the outer walls 20 of the end channels 15 and 18 be perpendicular to the sheet while the inner walls 21 slope from a narrower width at their outer portions to a wider width at the base; in this embodiment the depth of the channels was 48 mm. The inner channel or channels, of which only one channel 16 is depicted in FIG. 2, has both sides 22 sloping. The width of the bottom of the inner channel is advantageously larger than the width of the outer channel 15 and 18; in this embodiment the width of the inner channel was 50 mm while the width of the outer channels was 40 mm at their bases. We have found it advantageous that the outer walls 20 be straight or perpendicular to the sheet to facilitate the insertion of screws for the mounting of the electronic equipment shelves, as discussed below, while the sloping inner walls 21 and 22 both facilitate the manufacture of the sheet and provide access for screws for mounting cable harnesses on the inner surfaces of these sloping walls.

Figure 4:
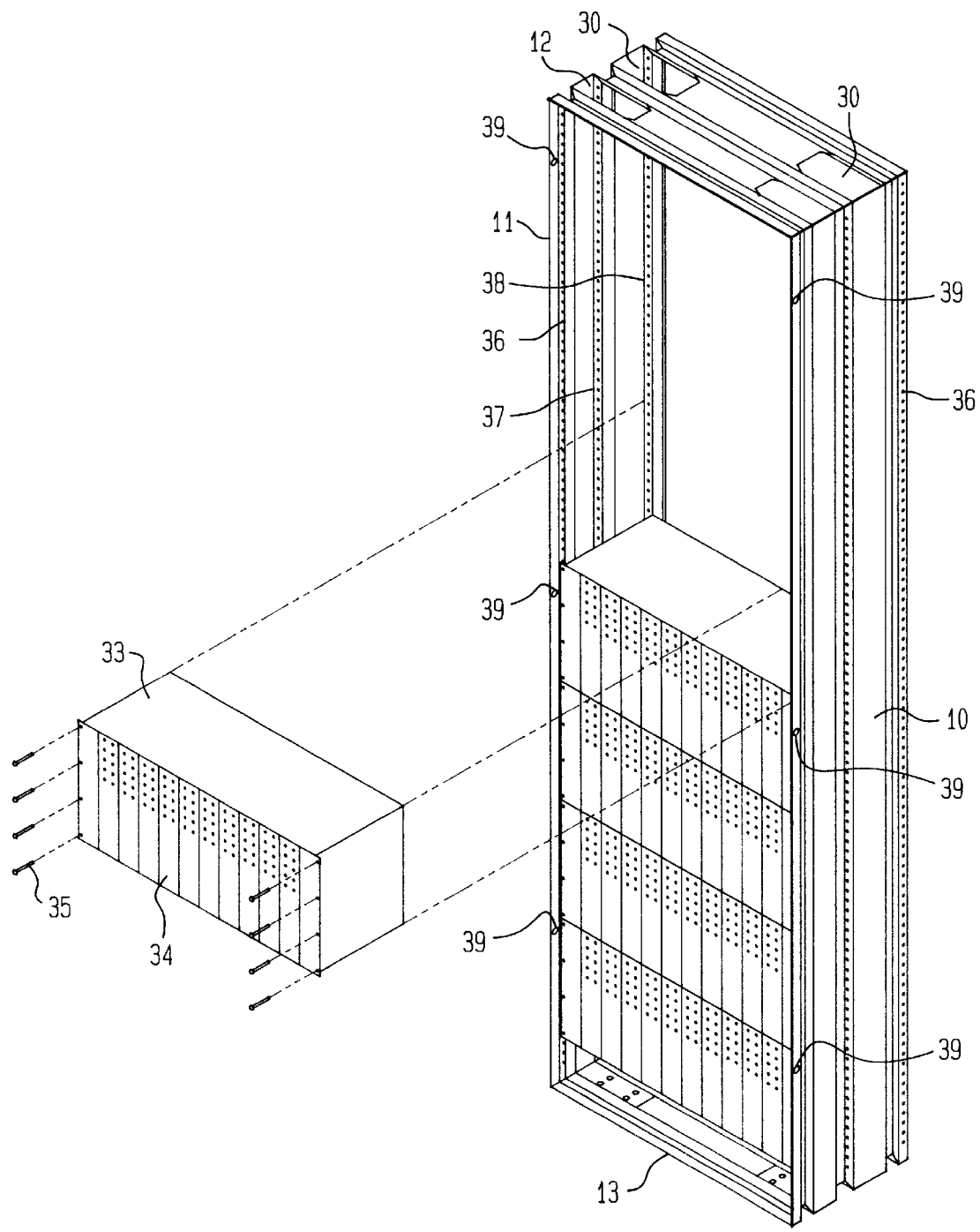
FIG. 4 is a perspective view of the embodiment of FIG. 1 with electronic equipment shelves mounted within the frame and with one shelf exploded to particularly depict that aspect of our invention for the mounting of the shelves directly by the side panels of the enclosure.

As best seen in FIG. 4, the electronic equipments 34 are positioned with in shelves 33 which are directly mounted by the side panels 10 and 11 by screws 35 which extend through apertures 36 in the outermost walls 20 of the outer channels of the corrugations of the side panels 11 and 12. In one specific embodiment we have found it advantageous to have the mounting apertures 36 with centers spaced only 25 mm apart the entire length of the side panels. The screws 35 may extend only through the apertures 36 in the front walls 20 of the side section channels or, if the equipment is particularly heavy, there may also be screws 35 extending through the rear walls of the side section channels. The screws may be thread forming screws or machine screws and, if desired, capture nuts may be positioned on the screws in the channels. Alternatively, the apertures 36 may be threaded.

The use of the corrugations themselves as the supporting members for the screws which hold the shelves assures a very rigid structure with the utmost simplicity and economy of construction.

Figure 2:
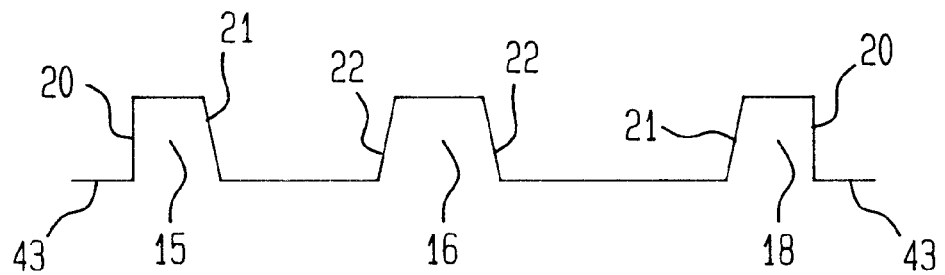
FIG. 2 is section view of any of the four panels comprising the enclosure in accordance with our invention as depicted in FIG. 1 showing the corrugated nature of the panels.

As seen in FIGS. 1 and 4, apertures 37, similar to apertures 36, extend through the sloping walls 22 of the inner channel of the corrugated side sections if desired apertures 38 may also extend through the sloping walls 21 of the outer channels of side sections. These apertures 37 and 38 provide support for screws which are utilized to hold clamps for cable harnesses extending through the channels to the electronic equipment 34 on the shelves 33.

Additionally, three or more apertures 39 extend through the flat end portions 43, as seen in FIG. 2. By means of these apertures adjacent enclosures may be secured together by screws or bolts. This provides a number of advantages. First, the direct physical connection of adjacent enclosures in accordance with our invention in a row or line-up increases their strength and earthquake resistance. In addition, because of the unique structure of the side sections of the enclosure in accordance with our invention, mating channels in the corrugated sheets provide internal air or cooling ducts to facilitate the withdrawal of heat from the electronic equipment 34 on the shelves 33.

Figure 3:
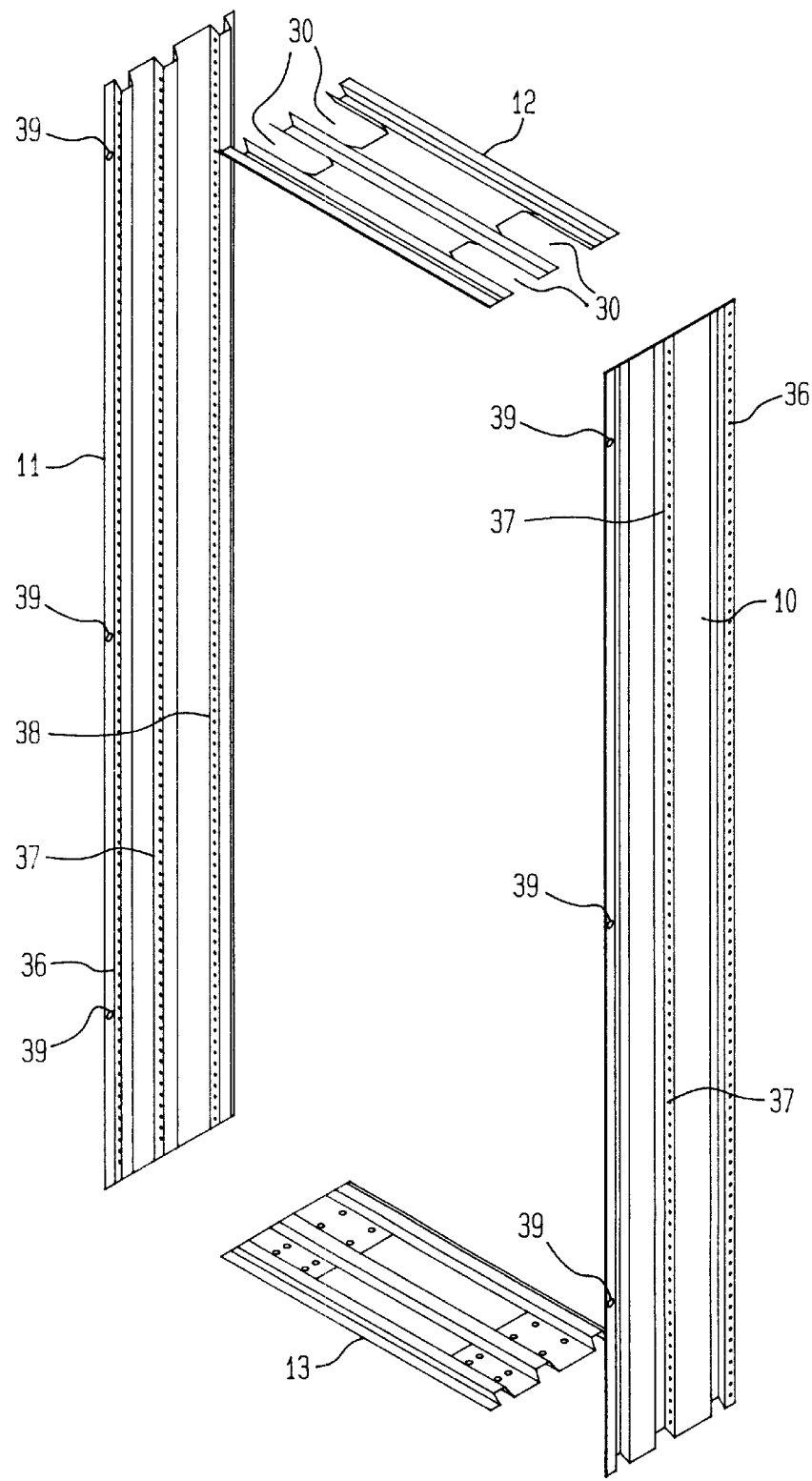
FIG. 3 is an exploded view of the enclosure of FIG. 1.

As seen in FIGS. 1 and 3, apertures or cutouts 30 are cut through one or more portions of the top panel between corrugations to provide for the entrance of electrical cables for connection to the electronic equipment mounted by the shelves 33. Adjustable framing members to facilitate the support of cable racks in the channels may be positioned as by welding in the apertures 30.

Figure 5:
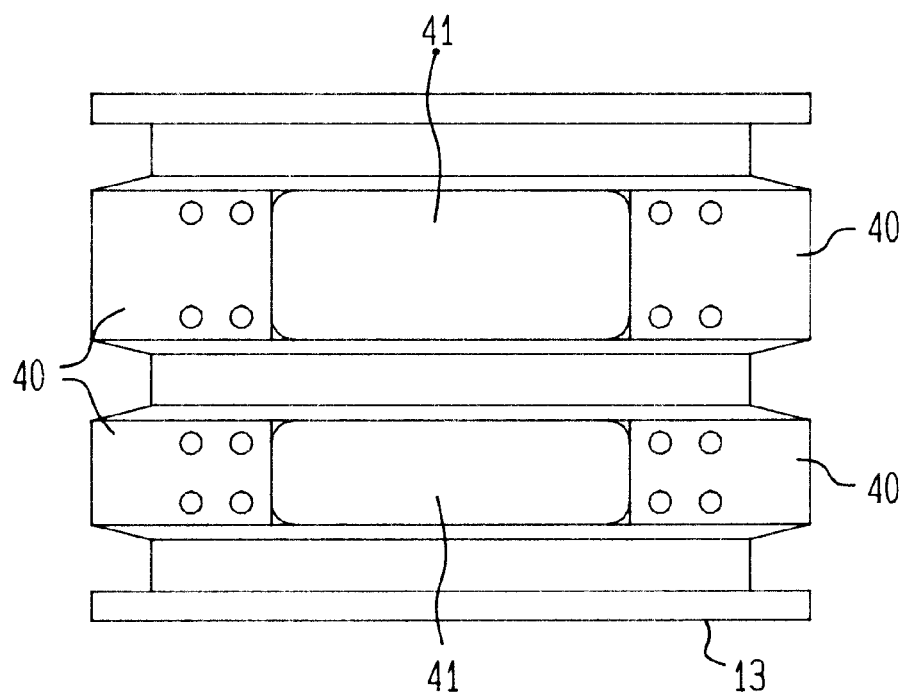
FIG. 5 is a top view of the base panel of the enclosure of FIG. 1.

The base panel 13, as best seen in FIG. 5, has a plurality of stress reducing anchor plates 40, advantageously of steel, welded to the inner surface of the flat or planar portion of the corrugated sheet for bolts to be inserted to secure the frame to a concrete or other floor. Further, between the anchor plates 40, the flat portion of the corrugated base panel 13 may be cut away, providing apertures 41 for cable entrance into the enclosure.

To convert the enclosure of FIG. 1 from a frame to a cabinet, it is only necessary to mount doors on both the front and back of the enclosure, or on only the front with a backing member closing off the rear of the enclosure. Advantageously a two fold door with louvers or perforations therein to facilitate heat transfer from within the enclosure may be held by hidden hinges to mount the door against the outer surfaces of the side members 10 and 11.

Figure 6:
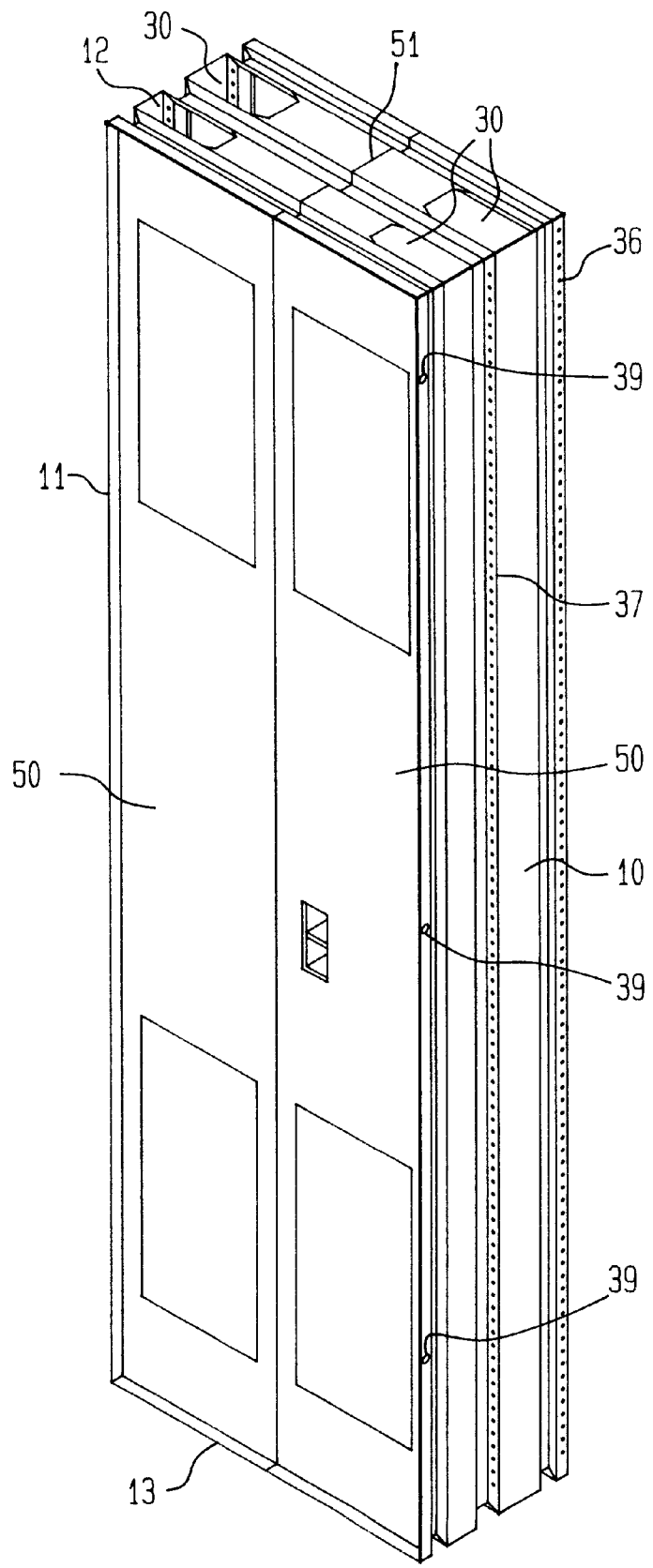
FIG. 6 is a perspective view of an alternate embodiment of our invention wherein the corrugated sections are formed by bending a single sheet and including doors, the enclosure being an equipment cabinet.

Such an enclosure in accordance with our invention as a cabinet is depicted in FIG. 6. As there seen the doors 50 are mounted by the side channels 10 and 11 to enclose the electronic equipment within the enclosure. Further, in this embodiment of our invention, the enclosure has been formed of a single corrugated sheet which has been crimped and then bent to define the right angle corners of the enclosure. In this embodiment, there are only two end surfaces of the corrugated sheet and they are joined together, as by weld 51, at the center of the top of the enclosure, where the earthquake load on the enclosure will be a minimum.

In the fabrication of our enclosure a single corrugated sheet may be first cut to the size desired for the side sections and the top and base sections. Since a single corrugated sheet is utilized, the channels of the corrugations will match when the panel sections are secured together to form a continuous corrugated structure. The sections are secured together by being held in a fixture which cuts their ends at matching 45° angles and then welds the matched ends together with full fillet miter joints. Alternatively, as discussed above, our enclosure may be fabricated by crimping the single corrugated sheet at four distances providing the desired lengths of the top, bottom, and side sections, then bending the sheet where crimped to define the corners of the enclosure, and then joining, as by welding, the two ends of the single sheet, advantageously at the center of the top section of the enclosure.

Accordingly, our invention based upon the use of relatively thin corrugated metal sheets maximizes the moment of inertia to make the panel sections as stiff as possible against the effects of bending loads while still providing for the spatial requirements of international standards, internal channels for signal and power cables, recesses for mounting doors (if desired for a cabinet), and surfaces for supporting the electronic equipment shelves, without requiring thick metal walls, separate uprights or supporting frame members, or special struts or internal structural members. The high stiffness of our corrugated enclosure provides excellent earthquake resistance and decreases the earthquake stress on the electronic equipment, without the multiplicity of structural members required by prior enclosures to achieve comparable strength and stiffness. Further, enclosures in accordance with our invention may readily be joined or junctioned in a row, thereby both increasing their earthquake resistance and providing cooling air ducts for the electronic equipment mounted within the enclosures.

The above description is exemplary of our invention. Numerous modifications and variations may be made by those skilled in the art without departing from the scope and spirit of our invention.

What is claimed is:

1. A unitized monocoque enclosure for housing electrical equipment and capable of withstanding earthquake loads without internal braces or support members and comprising side, top, and bottom panel sections of corrugated metal, said sections forming a continuous corrugated structure, and a plurality of shelves directly secured to said side sections and on which the electronic equipment may be placed, wherein said sections of corrugated metal have a plurality of channels with inner and outer walls and the outer walls of the exterior channels of said side sections have apertures therein, wherein screw elements extend through certain of said apertures to support said shelves, and wherein said outer of the exterior channels of said side sections are perpendicular to the plane of the corrugated metal sections and the inner walls of said exterior channels and the walls of at least one interior channel are at a sloping angle to the plane of said corrugated metal sections.

2. A unitized monocoque enclosure in accordance with claim 1 wherein said side, top, and bottom panels are separate sections, ends of said sections being cut at 45° and joined by full fillet welded miter joints.

3. A unitized monocoque enclosure in accordance with claim 1 wherein said side, top, and bottom panel sections are a continuous sheet, crimped and bent at the corners, and wherein the two outer edges of said continuous sheet are joined together substantially at the middle of the top panel section of the enclosure.

4. A unitized monocoque enclosure in accordance with claim 1 wherein the channels walls at a sloping angle to the plane of said corrugated metal defining said side panel sections have apertures therein for securing cable within the channels of said side panel sections.

5. A unitized monocoque enclosure in accordance with claim 1 wherein said top section has a cutout therein for internal cabling to extend through a channel of the corrugated metal side section for providing electrical connections to the electronic equipment on said shelves.

6. A unitized monocoque enclosure in accordance with claim 1 further comprising front doors mounted by said side sections whereby said enclosure is a cabinet.

7. A unitized monocoque enclosure for housing electrical equipment and capable of withstanding earthquake loads without internal braces or support members and comprising side, top, and bottom panel sections of corrugated metal, said sections forming a continuous corrugated structure, and a plurality of shelves directly secured to said side sections and on which the electronic equipment may be placed, wherein said corrugated sections comprise channel elements extending from a planar element and wherein said base section further comprises anchor plate members secured on top of said planar element between channels, and wherein two of said inner plate members are secured on top of said planar members between the same channels at opposite ends of said base member and said base member further includes an aperture therethrough between said two anchor plate members for electrical cabling to enter into said enclosure.

8. An equipment enclosure for electronic equipment comprising a first pair of equal length corrugated metal sheet side sections and a second paid of equal length corrugated metal sheet cross sections, said first and second pair sections being of the same width and having the same corrugations, and electronic equipment shelves within the enclosure and mounted directly by said first pair of side sections, whereby said corrugated metal sections carry the weight of said shelves and any equipment supported thereon, and wherein the corrugations of the corrugated metal sheet of said sections comprise two exterior channels and at least one interior channel, said channels having inner and outer walls, the outer wall of said exterior channels being perpendicular to the plane of the corrugated sheet and the inner wall of said exterior channels and the walls of said one or more interior channels being at a sloping angle to said plane of said sheet.

9. An equipment enclosure in accordance with claim 8 wherein said corrugated metal sheet side sections and said corrugated metal sheet cross sections are welded together at their ends to define the enclosure.

10. An equipment enclosure in accordance with claim 8 wherein said side and cross sections are formed of a continuous corrugated metal sheet, the ends of said sheet being joined together substantially at the middle of the upper cross section of the enclosure.

11. An equipment enclosure in accordance with claim 8 wherein said top and bottom cross sections have cutouts therein to allow passage of cables into the interior of the enclosure.

12. An equipment enclosure in accordance with claims 8 wherein each of said corrugations of said side sections has apertures in the outer walls of said exterior channels of said sections and screw elements extending through certain of said apertures to mount said shelves.

13. A unitized monocoque enclosure for housing electrical equipment and capable of withstanding earthquake loads without internal braces, support members, separate uprights, or special struts or internal structural members, said enclosure comprising side, top and bottom panel sections being themselves only of corrugated metal defining a plurality of channels and forming a continuous corrugated structure, and a plurality of shelves directly connected to said side sections and on which the electrical equipment may be placed, said top panel section having a plurality of cutouts therein mating with the channels in said side sections for entrance of electrical cables into said channels of said side sections for connection to the electrical equipment on said shelves.

14. A unitized monocoque equipment enclosure in accordance with claim 11 further comprising plate members secured to the bottom panel section for attaching the enclosure to a floor.

15. An equipment enclosure for electronic equipment comprising a first pair of equal length corrugated metal sheet side sections and a second pair of equal length corrugated metal sheet cross sections, said first and second pair sections being of the same width and having the same corrugations thereby to form a continuous structure with the channels formed by the corrugations of said side sections mating with the channels formed by the corrugations of said cross sections and at least one of said cross sections having a cut out therein mating with a channel of at least one of said side sections, and electronic equipment shelves within the enclosure and mounted directly by said first pair of said sections, whereby said corrugated metal sections carry the weight of said shelves and any equipment supported thereon and electrical cable can be introduced through said one cut out into said channel of said at least one side section for connection to electronic equipment on said shelves.

16. An equipment enclosure in accordance with claim 15 wherein both said cross sections have cut outs therein to allow passage of electrical cables into the interior of the enclosure for connection to the electronic equipment on said shelves.

17. An equipment enclosure in accordance with claim 15 further comprising a plurality of plate members secured to the lower of said cross sections for attaching the enclosure to a floor.

\* \* \* \* \*

UNITED STATES PATENT AND TRADEMARK OFFICE
CERTIFICATE OF CORRECTION

PATENT NO.         : 5,979,672
APPLICATION NO.    : 08/630304
DATED              : November 9, 1999
INVENTOR(S)        : Richard J. Gemra et al.

Page 1 of 1

It is certified that error appears in the above-identified patent and that said Letters Patent is hereby corrected as shown below:

Title page, References Cited, item [56], line 3, following the line stating "U.S. PATENT DOCUMENTS", insert the following six citations:

--3,143,827  8/1964 D.J. Showalter ............................... 50/67
  3,555,761  1/1971 N.J. Costanzo .............................. 52/588
  3,568,388  3/1971 C.T. Flachbarth ........................... 52/588
  3,759,006  9/1973 M.P.J.J. Tamboise ........................ 52/406
  3,802,146  4/1974 W.H. Tacke et al. ......................... 52/624
  4,600,249  7/1986 T.W. Anderson ........................... 312/196--

References Cited, item [56], line 10, following the citation to U.S. Pat. No. 5,328,260, insert the following citation:

--5,364,178  11/1994 Hofman et al. ............................. 312/263--

Signed and Sealed this
Fifteenth Day of February, 2011

David J. Kappos
*Director of the United States Patent and Trademark Office*